United States Patent
Shen et al.

(10) Patent No.: US 8,473,817 B2
(45) Date of Patent: *Jun. 25, 2013

(54) LDPC (LOW DENSITY PARITY CHECK) CODE SIZE ADJUSTMENT BY SHORTENING AND PUNCTURING

(75) Inventors: Ba-Zhong Shen, Irvine, CA (US); Tak K. Lee, Irvine, CA (US); Kelly Brian Cameron, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 869 days.

This patent is subject to a terminal disclaimer.

(21) Appl. No.: 12/632,552

(22) Filed: Dec. 7, 2009

(65) Prior Publication Data

US 2010/0083071 A1 Apr. 1, 2010

Related U.S. Application Data

(63) Continuation of application No. 11/417,316, filed on May 3, 2006, now Pat. No. 7,631,246.

(60) Provisional application No. 60/757,358, filed on Jan. 9, 2006.

(51) Int. Cl.
*H03M 13/35* (2006.01)

(52) U.S. Cl.
USPC .......................................................... 714/774

(58) Field of Classification Search
USPC .......................................................... 714/774
See application file for complete search history.

(56) References Cited

U.S. PATENT DOCUMENTS

| | | | | |
|---|---|---|---|---|
| 3,542,756 A * | 11/1970 | Gallager | ........................ | 714/762 |
| 3,665,396 A * | 5/1972 | Forney, Jr. | ..................... | 714/789 |
| 4,295,218 A * | 10/1981 | Tanner | ........................ | 714/762 |
| 6,430,233 B1 * | 8/2002 | Dillon et al. | ................... | 375/316 |
| 6,473,010 B1 * | 10/2002 | Vityaev et al. | ................ | 341/107 |
| 6,567,465 B2 * | 5/2003 | Goldstein et al. | .............. | 375/222 |
| 6,633,856 B2 * | 10/2003 | Richardson et al. | ............ | 706/15 |
| 7,171,603 B2 * | 1/2007 | Classon et al. | ................ | 714/752 |
| 7,222,284 B2 * | 5/2007 | Stolpman | ........................ | 714/774 |
| 7,263,651 B2 * | 8/2007 | Xia et al. | ........................ | 714/774 |
| 7,483,496 B2 * | 1/2009 | Eroz et al. | ...................... | 375/316 |
| 7,493,551 B2 * | 2/2009 | Berens et al. | .................. | 714/790 |
| 7,502,987 B2 * | 3/2009 | Kyung et al. | ................... | 714/781 |
| 7,631,246 B2 * | 12/2009 | Shen et al. | ...................... | 714/774 |
| 2003/0104788 A1 * | 6/2003 | Kim | ................................. | 706/15 |

OTHER PUBLICATIONS

Dholakia et al., "Rate-Compatible Low-Density Parity-Check Codes for Digital Subscriber Lines", IEEE ICC, Jun. 2004, pp. 415-419.*

* cited by examiner

*Primary Examiner* — Stephen M Baker
(74) *Attorney, Agent, or Firm* — Garlick & Markison; Shayne X. Short (57) ABSTRACT

LDPC (Low Density Parity Check) code size adjustment by shortening and puncturing. A variety of LDPC coded signals may be generated from an initial LDPC code using selected shortening and puncturing. Using LDPC code size adjustment approach, a single communication device whose hardware design is capable of processing the original LDPC code is also capable to process the various other LDPC codes constructed from the original LDPC code after undergoing appropriate shortening and puncturing. This provides significant design simplification and reduction in complexity because the same hardware can be implemented to accommodate the various LDPC codes generated from the original LDPC code. Therefore, a multi-LDPC code capable communication device can be implemented that is capable to process several of the generated LDPC codes. This approach allows for great flexibility in the LDPC code design, in that, the original code rate can be maintained after performing the shortening and puncturing.

20 Claims, 9 Drawing Sheets

LDPC (LOW DENSITY PARITY CHECK) CODE SIZE ADJUSTMENT BY SHORTENING AND PUNCTURING

CROSS REFERENCE TO RELATED PATENTS/PATENT APPLICATIONS

Continuation Priority Claim, 35 U.S.C. §120

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility application Ser. No. 11/417,316, entitled "LDPC (Low Density Parity Check) code size adjustment by shortening and puncturing,", filed May 3, 2006, pending, and scheduled to be issued as U.S. Pat. No. 7,631,246 on Dec. 8, 2009, which claims priority pursuant to 35 U.S.C. §119(e) to the following U.S. Provisional Patent Application which is hereby incorporated herein by reference in its entirety and made part of the present U.S. Utility Patent Application for all purposes:

a. U.S. Provisional Application Ser. No. 60/757,358, entitled "LDPC (Low Density Parity Check) code size adjustment by shortening and puncturing,", filed Jan. 9, 2006, now expired.

BACKGROUND OF THE INVENTION

1. Technical Field of the Invention

The invention relates generally to communication systems; and, more particularly, it relates to encoding and decoding signals employed within such communication systems.

2. Description of Related Art

Data communication systems have been under continual development for many years. One such type of communication system that continues to be of significant interest is that which employs iterative error correction codes. Of particular interest is a communication system that employs LDPC (Low Density Parity Check) code. Communications systems with iterative codes are often able to achieve lower BER (Bit Error Rate) than alternative codes for a given SNR (Signal to Noise Ratio).

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10 GBASE-T) emerging standard) as well as communication systems operating within a wireless context (e.g., in the IEEE 802.11 context space including the IEEE 802.11n emerging standard). In general, LDPC coding can be applied to any type of communication system in which data is sent from one place to another where error correction capability is desired.

For any of these particular communication system application areas, near-capacity achieving error correction codes are very desirable. The latency constraints, which would be involved by using traditional concatenated codes, simply preclude their use in such applications in very high data rate communication system application areas.

When performing processing of such LDPC signals within communication systems, a designer has quite a degree of freedom by which to implement the hardware to perform such encoding and/or decoding processing. However, in many communication systems, such as wireless LAN and satellite communication system, multiple error correcting codes each possible having different block sizes and different code rates are oftentimes needed. For example, a typical prior art approach is to design and construct multiple LDPC codes to accommodate each of the different block sizes and code rates required for the particular communication system application. For example, in IEEE 802.11n Joint Proposal (depicted further below using reference [d]), twelve (12) distinct codes are constructed for four (4) different code rates. Each code rate has three (3) different block sizes, and every block size has its own code structure. Currently, the typical approach in the art is to employ separate and distinct functional blocks and/or circuitry portions within a communication device to perform the appropriate processing for each of these different LDPC codes. This approach inherently requires more hardware in implementation. In other words, within communication devices that seek to operate on a variety of LDPC codes (i.e., variable code rate and/or modulation type communication devices), the typical design approach is to provision separate functional blocks and/or circuitry for each of the separate LDPC codes which are to be processed.

This can prove to be very expensive in terms of a variety of cost factors including real estate, actual dollar cost, and complexity in terms of the number of gates required within the communication device. With the continual advent of communication devices and communication systems being designed to accommodate multi-code types signals (including multi-code rate and/or multi-modulation types signals whose code rate and/or modulation can vary as frequently as on a symbol by symbol or frame by frame basis), there continues to be a need in the art for better and more efficient LDPC code design as well as the associated hardware that is designed and implemented to support such LDPC codes.

In the art of communication systems and communication devices that employ multiple LDPC code signals, shortening and puncturing can be performed to generate the various LDPC coded signals. However, using the prior art approaches of shortening and puncturing, the LDPC codes resulting there from inherently require the multiple functional block and/or circuitry approach to hardware design, in that, each of the resulting LDPC codes have a different code structure. In addition, many of the prior art approaches to shortening and puncturing require a particular shortening and puncturing ratio which also inherently narrows the type of LDPC codes which can be selected and designed while still complying with those particular shortening and puncturing approaches.

The following 5 references describe some prior art approaches to multiple LDPC code design, some of which employ prior art approaches to shortening and puncturing.

[a] PHY Advanced Coding "ad hoc" team, "Motion JP-K043: Low-Density Parity Check (LDPC) Code and Encoding Procedure Definition," 7 pages.

[b] Motorola, "Column weight distribution," Nov. 15, 2005, 5 pages.

[c] Huaning Niu and Chiu Ngo, Samsung, "Performance evaluation of different shortening schemes puncturing patens," Nov. 29, 2005, 23 pages.

[d] Syed Aon Mujtaba, Agere Systems Inc., "TGn Sync Proposal Technical Specification," doc.: IEEE 802.11-04/0889r7, IEEE P802.11 Wireless LANs, 133 pages.

[e] Michael Livshits, Nortel Networks Limited, "Shortening and puncturing performance analysis," Dec. 7, 2005, 4 pages.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
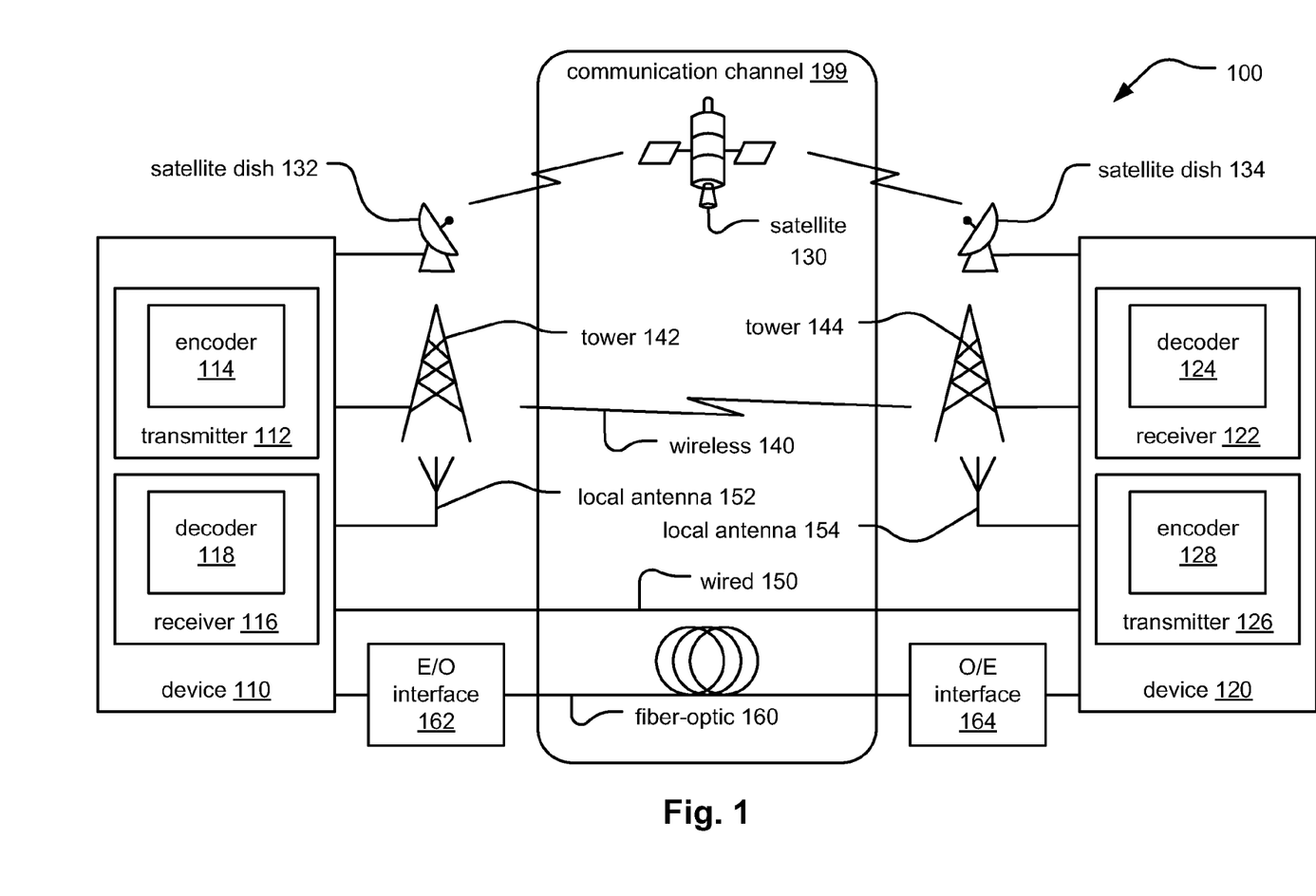
FIG. 1 is a diagram illustrating various possible embodiments of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

FIG. 1 is a diagram illustrating various possible embodiments of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

In general, the various coding principles presented herein may be applied to any system that performs encoding of digital information to be transmitted across a communication channel or that performs decoding of a signal that has digital information encoded therein. Additional application areas include the storage and retrieval of information within media storage devices (e.g., hard disk drives) in which encoding and/or decoding of digital information is performed.

To reduce transmission errors that may undesirably be incurred within a communication system, error correction and channel coding schemes are often employed. Generally, these error correction and channel coding schemes involve the use of an encoder at the transmitter side of the communication channel and a decoder at the receiver side of the communication channel.

Encoding and Decoding with Shortening:

Let a binary LDPC code has block size n and k information bits. Then its code rate is r=k/n. Consider a systematic encoder of this LDPC code, which generates k input bits, $b_0, \ldots b_{k-1}$ to a size n codeword $c_0, \ldots, c_{n-1}$, where $c_i = b_i$, i=0, ..., k−1. Let s be the shortening length and $j_1, \ldots, j_s$ are shortening positions. Let $i_0 < i_1 \leq \ldots < i_{k_1-1}$, where $k_1 = k - s$ be the ordered numbers of the set $\{0, \ldots, k-1\} / \{j_1, \ldots, j_s\}$. Then shortening with these given positions in encoding of $k_1$ data bits $\overline{b}_0, \ldots, \overline{b}_{k_1-1}$ can be realized by inputting $b_0, \ldots, b_{k-1}$ with $b_{j_l} = 0$, l=1, ..., $k_1$ and $b_{i_l} = \overline{b}_l$, l=1, ..., $k_1 - 1$ to the LDPC encoder. Let $c_k, \ldots, c_{n-1}$ be the redundancy (or check) bits of the LDPC encoder. Then the output of the shortened codeword is $b_{i_0}, b_{i_1}, \ldots, b_{i_k-1}, c_k, \ldots, c_{n-1}$. Moreover, the code rate of the shortened codeword is (k−s)/(n−s).

In decoding side, the bit metric of the positions $i_0, \ldots, i_{k_1}$, k, ..., n−1 are obtained as usually from the received signals. However, since the decoder knows that in position $j_1, \ldots, j_s$ the inputted bits are 0, the decoder assigns a fixed value to those metric (e.g. assign a maximal or minimal value depends on the decoding approach being employed).

Encoding and Decoding with Puncturing:

Suppose a binary LDPC code has block size n and k information bits. Then its code rate is r=k/n. Consider a systematic encoder of this LDPC code, which generates k input bits, $b_0, \ldots, b_{k-1}$ to a size n codeword $c_0, \ldots, c_{n-1}$, where $c_i = b_i$, i=0, ..., k−1. Let p be the puncturing length and $j_1, \ldots, j_p$ are puncturing positions. Let $i_0 < i_1 < \ldots < i_{n-1}$, where $r_1 = n - k - p$ be the ordered numbers of the set $\{k, \ldots, n-k-1\} / \{j_1, \ldots, j_p\}$. Then puncturing with these given positions in encoding with the data bits $b_0, \ldots, b_{k-1}$ can be realized by inputting $b_0, \ldots, b_{k-1}$ to the LDPC encoder and replacing the original check bits $c_k, \ldots, c_{n-1}$ by $c_{i_0}, \ldots, c_{i_{r_1-1}}$. Moreover, the code rate of the punctured codeword is k/(n−p).

In decoding side, the bit metric of the positions $0, \ldots, k-1$, $i_0, \ldots, i_{r_1-1}$ are obtained as usually from the received signals. However, since the decoder does not know what is the real value of position $j_1, \ldots, j_p$, the decoder assigns a neutral value (e.g., 0) to those metrics.

Adjusting Codeword Size with Shortening and Puncturing:

Suppose a binary LDPC code has block size N and K information bits. Moreover, suppose K=kq and N=nq. Then, the code rate of the code is K/N=k/n. By shortening kt positions and puncturing (n−k)t positions of an LDPC codeword, one can obtain a codeword with a reduced block size N−nt=n(q−t) and rate (K−kt)/(n(q−t))=k/n. The encoding and decoding of this codeword can be operated by combining the operations in the two sections above, namely, "Encoding and decoding with shortening" and "Encoding and decoding with puncturing".

Consider LDPC codes proposed in 802.11n JP codes the [a] reference depicted above, there are 4 code rates, namely, the 4 LDPC codes having code rates of 1/2, 2/3, 3/4 and 5/6 and having 3 different block sizes, namely 1944, 1296, and 648. In the proposal of the [a] reference, the low density parity check matrix, H, of the codes are constructed by sub-matrices. Block size 1944 code has sub-matrices size 81, block size 1296 has sub-matrices size 54 and block size 648 has sub-matrices size 27.

Example 1

Consider rate 1/2 block size 1944 LDPC code in the [a] reference. Let q=81. Then N=24, q=1944, K=12, q=972, i.e. n=24 and k=12. Let 1=27, then by shortening kt=324 bits and by puncturing (n−k)t=324 bits from a block size 1944 codeword, one can obtain a block size 1296 rate 1/2 codeword. Let t=54, then shortening kt=648 bits and puncturing (n−k)t=648 bits from a block size 1944 codeword, one can obtain a block size 1296 rate 1/2 codeword.

Example 2

Consider rate 5/6 block size 1944 LDPC code in the [a] reference. Let q=81. Then N=24, q=1944, K=4, q=324, i.e. n=24 and k=20. Let t=27, then by shortening kt=540 bits and by puncturing (n−k)t=108 bits from a block size 1944 codeword, one can obtain a block size 1296 rate 5/6 codeword. Let t=54, then shortening kt=1080 bits and puncturing (n−k)t=216 bits from a block size 1944 codeword, one can obtain a block size 648 rate 5/6 codeword.

A novel and improved approach to shortening and puncturing is presented below which allows for a greater flexibility in the LDPC codes that can be selected, allows for a singular functional block and/or circuitry portion to perform encoding processing (or decoding processing) according to a variety of LDPC codes.

Figure 2:
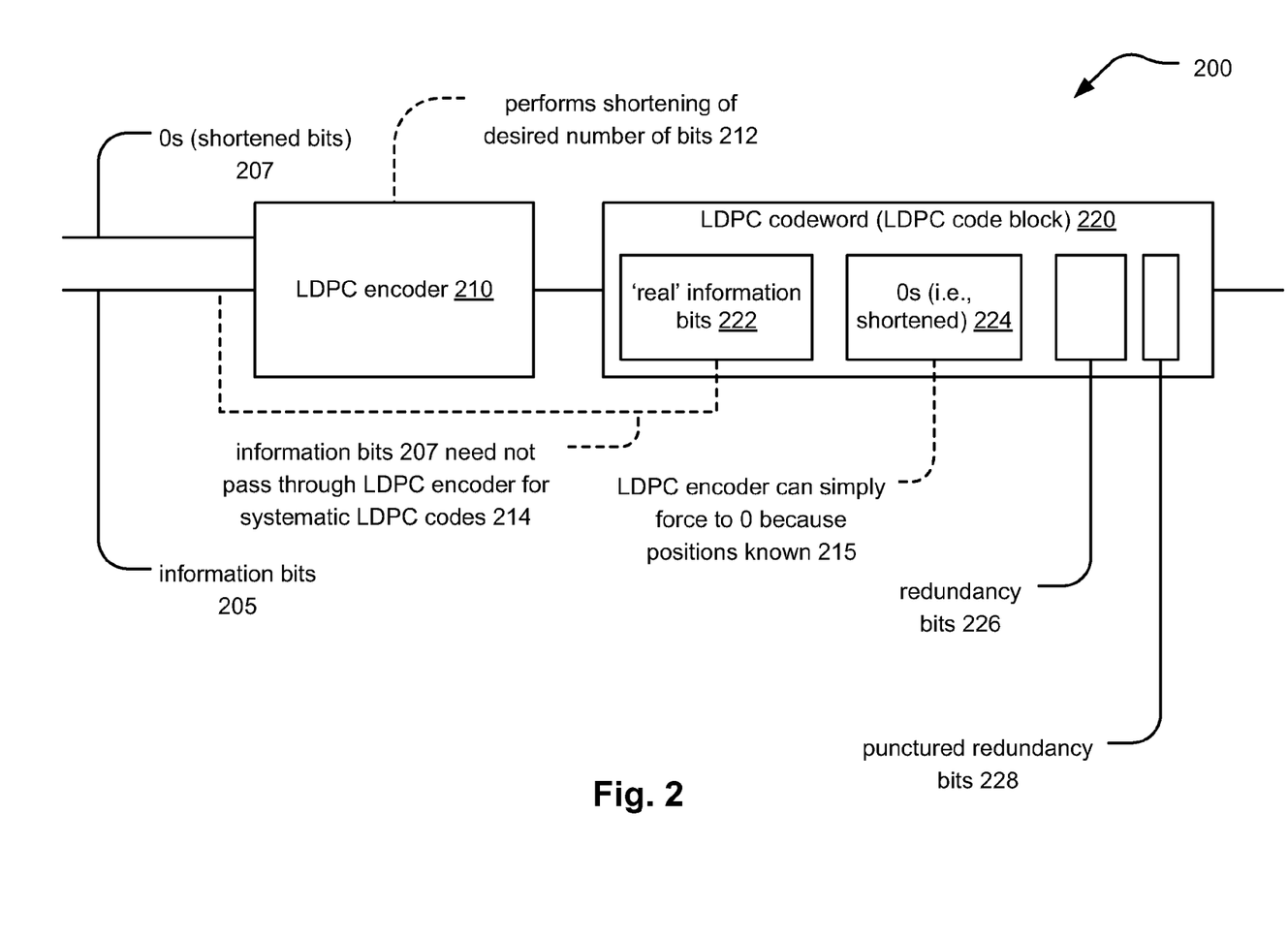
FIG. 2 illustrates an embodiment of LDPC encoding system.

FIG. 2 illustrates an embodiment of an LDPC encoding system 200. Information bits 205 and zero valued bits (i.e., shortened bits or 0s) 207 are provided to an LDPC encoder 210 that is operable to generate an LDPC codeword (or LDPC code block) 220 there from. When considering a systematic LDPC code, the LDPC codeword 220 includes the actual 'real' information bits 222 (which are the same as the information bits 205 provided to the LDPC encoder 210), zero valued bits (i.e., shortened bits or 0s) 224, redundancy bits 226, and punctured redundancy bits 228. If desired, as depicted using reference numeral 214, the information bits 207 can be provided directly as part of the LDPC codeword 220, in that, they need not be taken as output from the LDPC encoder 210. Since the information bits are explicitly represented within the LDPC codeword 220, they can be provided directly to the LDPC codeword 220. It is noted that any shortened bits 224 and any punctured redundancy bits 228 are not transmitted. In addition, it is noted that the shortened bits 224 may be distributed throughout various portions of the original information bits within the original LDPC codeword 220 (i.e., before any shortening is performed). Analogously, it is noted that the punctured redundancy bits 228 may be distributed throughout various portions of the original redundancy bits within the original LDPC codeword 220 (i.e., before any puncturing is performed).

The LDPC encoder 210 performs shortening of a desired number of bits, as shown using reference numeral 212, for the particular shortening and puncturing being performed when encoding according to the appropriate LDPC code. In addition, to generate the zero valued bits (i.e., shortened bits or 0s) 224 within the LDPC codeword 220, the LDPC encoder 210 can simply place or force those positions to 0, since they are known beforehand, as shown using reference numeral 215.

The novel shortening and puncturing approach presented herein also allows for a broader range of LDPC codes to be generated that is possible using prior art shortening and puncturing approaches. As one example of the increased flexibility of LDPC code design available by using this new approach, the shortening and puncturing ratio required according to many prior art approaches is obviated by the novel approach to shortening and puncturing presented herein. This novel shortening and puncturing approach allows for a shortening and puncturing ratio of 1, thereby allowing for easy maintenance of the same code rate for each of the different LDPC codes generated using this novel shortening and puncturing approach.

Moreover, while this novel approach provides a great simplicity in terms of complexity and hardware in implementation, this novel approach to shortening and puncturing does not suffer a significant degradation in performance when compared to prior art shortening and puncturing approaches.

Consider irregular LDPC codes with its low density parity check matrix, H, consists of sub-matrix such as $$H = \begin{bmatrix} S_{0,0} & S_{0,1} & \ldots & S_{0,n-1} \\ & \ldots & \\ S_{l,0} & S_{l,1} & \ldots & S_{l,n-1} \end{bmatrix} \quad (EQ\ 1)$$

where $S_{i,j}$ is an m×m sub-matrix, which is either all 0 matrix (i.e., all entries are 0) or a CSI (Cyclic Shifted Identity) matrix (or permutation matrix). If the number of non-zero sub-matrices in all rows of the low density parity check matrix, H, is the same as the number of non-zero sub-matrices in all columns of the low density parity check matrix, H, then the LDPC codes generated thereby are regular; otherwise, the LDPC codes generated thereby are irregular. Moreover, the block size of the LDPC code is N, where N=mn.

The base matrix, $H_{base}$, of the low density parity check matrix, H, depicted by (EQ 1) is provided as $$H_{base} = \begin{bmatrix} b_{0,0} & b_{0,1} & \ldots & b_{0,n-1} \\ & \ldots & \\ b_{l,0} & b_{l,1} & \ldots & b_{l,n-1} \end{bmatrix} \quad (EQ\ 2)$$

where $b_{i,j}=1$ if the sub-matrix, $S_{i,j}$, is a non-zero matrix, and 0 otherwise.

For example, when considering a 6×8 low density parity check matrix, H, that is composed of 2×2 sub-matrices as follows:

$$H = \begin{bmatrix} \begin{bmatrix} 1 & 0 \\ 0 & 1 \end{bmatrix} & \begin{bmatrix} 0 & 0 \\ 0 & 0 \end{bmatrix} & \begin{bmatrix} 0 & 1 \\ 1 & 0 \end{bmatrix} & \begin{bmatrix} 0 & 0 \\ 0 & 0 \end{bmatrix} \\ \begin{bmatrix} 0 & 0 \\ 0 & 0 \end{bmatrix} & \begin{bmatrix} 1 & 0 \\ 0 & 1 \end{bmatrix} & \begin{bmatrix} 0 & 1 \\ 1 & 0 \end{bmatrix} & \begin{bmatrix} 1 & 0 \\ 0 & 1 \end{bmatrix} \\ \begin{bmatrix} 1 & 0 \\ 0 & 1 \end{bmatrix} & \begin{bmatrix} 0 & 1 \\ 1 & 0 \end{bmatrix} & \begin{bmatrix} 0 & 0 \\ 0 & 0 \end{bmatrix} & \begin{bmatrix} 0 & 1 \\ 1 & 0 \end{bmatrix} \end{bmatrix}, \quad (EQ\ 3)$$

then base matrix of this matrix depicted above in (EQ 3) is shown as follows:

$$H_{base} = \begin{bmatrix} 1 & 0 & 1 & 0 \\ 0 & 1 & 1 & 1 \\ 1 & 1 & 0 & 1 \end{bmatrix}. \quad (EQ\ 4)$$

The following relationships are employed below: N=nm and K=km. Some special sub-classes of irregular (n,k) LDPC codes have their low density parity check matrix, H, defined by H=[$H_1$,$H_2$] such that $H_1$ is a (n−k)×k matrix and $H_2$ is a (n−k)×(n−k) matrix. Each of these matrices, $H_1$ and $H_2$, is composed of special sub-matrices as described below. Again, the block size of the LDPC code is N, where N=mn, and K is the dimension of the LDPC code, where K=km.

There are at least 4 such classes, listed as follows with respect to their $H_2$ matrix component:

Class 1:

$$H_2 = \begin{bmatrix} I & 0 & \cdots & 0 & 0 \\ I & I & & 0 & 0 \\ \vdots & \vdots & \ddots & \vdots & \vdots \\ 0 & 0 & & I & 0 \\ 0 & 0 & \cdots & I & I \end{bmatrix}$$

where I is an m×m identity matrix and 0 is an m×m zero-matrix (i.e., all entries are value 0).

Class 2:

$$H_2 = \begin{bmatrix} I & 0 & \cdots & 0 & I(-1) \\ I & I & & 0 & 0 \\ \vdots & \vdots & \ddots & \vdots & \vdots \\ 0 & 0 & & I & 0 \\ 0 & 0 & \cdots & I & I \end{bmatrix}$$

where I(−1) is an m×m matrix obtained by left cyclic shifting one position of the identity matrix, I.

Class 3:

$$H_2 = \begin{bmatrix} I & 0 & \cdots & 0 & D \\ I & I & & 0 & 0 \\ \vdots & \vdots & \ddots & \vdots & \vdots \\ 0 & 0 & & I & 0 \\ 0 & 0 & \cdots & I & I \end{bmatrix}$$

where D is obtained by replacing the first row of I(−1) by an all zero-valued vector, i.e., $$D = \begin{bmatrix} 0 & 0 & \cdots & 0 \\ 1 & 0 & & 0 \\ & 1 & & \\ & & \ddots & \\ 0 & 0 & & 1 \end{bmatrix}$$

Class 4:

$H_2 = [H_{2,0},\ H_{2,1}]$, where $H_{2,0}$ is a [(n−k)m]×[(n−k−1)m] matrix and $H_{2,1}$ is a [(n−k)m]×m matrix such that $$H_{2,0} = \begin{bmatrix} I & 0 & \cdots & 0 & 0 \\ I & I & & 0 & 0 \\ \vdots & \vdots & \ddots & \vdots & \vdots \\ 0 & 0 & & I & 0 \\ 0 & 0 & \cdots & I & I \end{bmatrix}, \text{and}$$

$H_{2,1} = [I(t)\ 0\ \ldots\ 0\ I\ 0\ \ldots\ 0\ I(t)]^T$, where "T" indicates transpose.

where I(t) is an m×m matrix obtained by right cyclic shifting m positions of the identity matrix, I.

One prior art approach to shortening and puncturing is referred to as the "text book" approach (sometimes referred to in the various diagrams as TBSP). This "text book" approach involves shortening of s bits being performed by shortening the first (or last) s consecutive information bits. This "text book" approach involves puncturing of p bits being performed puncturing the last p consecutive redundancy bits.

In the [b] reference and the [c] reference depicted above, contributors from Motorola and Samsung suggest 2 other possible shortening methods, namely, "evenly distribute s zeros to information bit position" and "cycle through the block columns", i.e., $\lfloor s/k \rfloor$ zeros in every information block columns (i.e., every column j, $S_{i,j}$ for all i=0, ..., 1 (EQ 1)), the remainder in the first s−k$\lfloor s/k \rfloor$ information block columns, where k is the base matrix information size.

In the [c] reference and the [d] reference depicted above, the "text book" puncturing method (i.e., puncturing the last consecutive bits) is suggested. In [c], another approach is discussed which involves puncturing the alternate parity bits, and it is shown that the "text book" approach outperforms the alternate parity bits approach.

A novel approach to performing shortening and puncturing is presented below.

An low density parity check matrix, H, of an (n,k) LDPC code is composed of m×m sub-matrices, $S_{i,j}$.

$$H = \begin{bmatrix} S_{0,0} & S_{0,1} & \ldots & S_{0,k-1} & \ldots & S_{0,n-1} \\ \ldots & & \ldots & \ldots & \ldots & \ldots \\ S_{l,0} & S_{l,1} & \ldots & S_{l,k-1} & \ldots & S_{l,n-1} \end{bmatrix} \quad (EQ\ 5)$$

The shortened and punctured code is obtained from this original LDPC code. A codeword from the original LDPC code is depicted below.

$$C = (c_0, c_1, \ldots, c_{n-1}) \quad (EQ\ 6)$$

Each element of the codeword is depicted below.

$$c_i = (c_{i,0}, c_{i,1}, \ldots, c_{i,m-1}) \quad (EQ\ 7)$$

Figure 3:
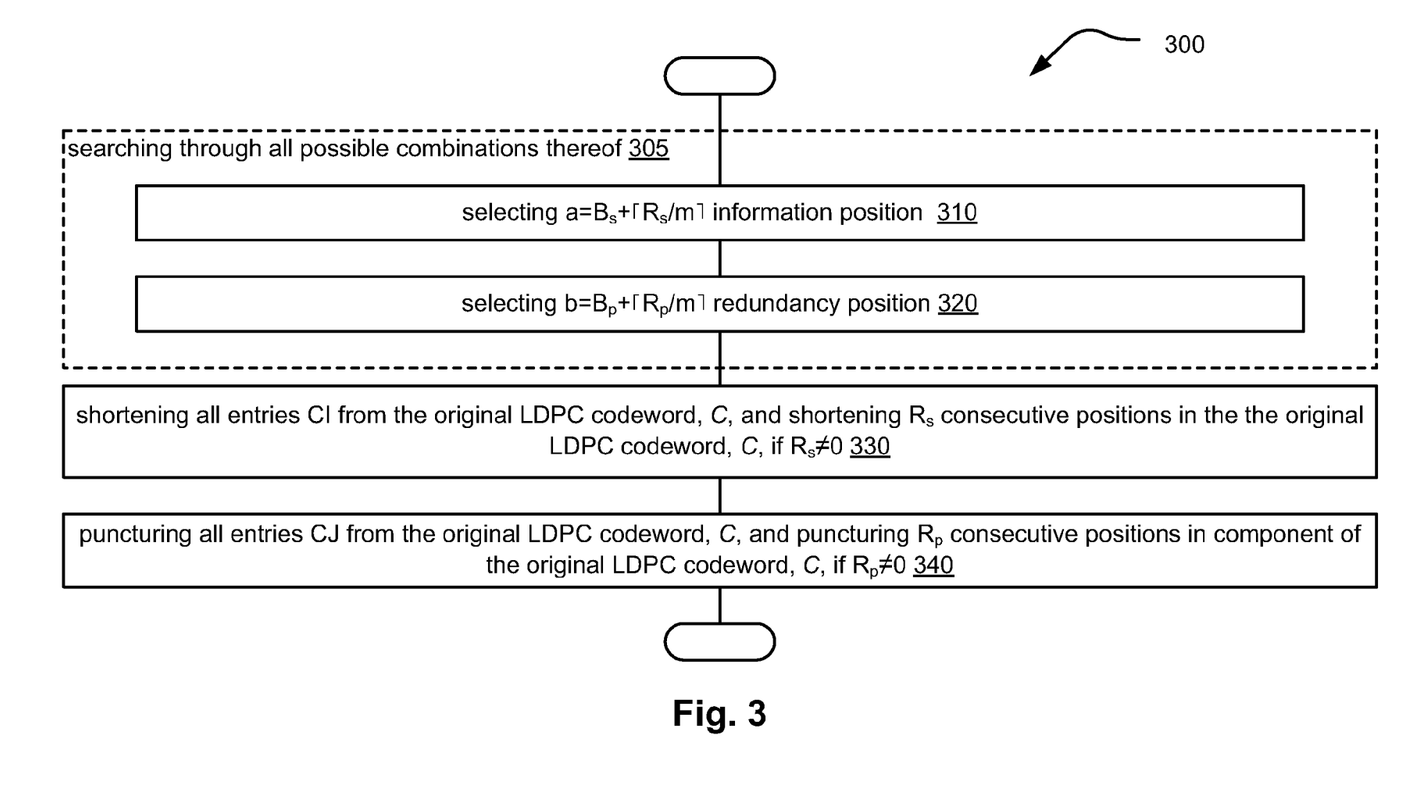
FIG. 3 illustrates an embodiment of a method for shortening and puncturing.

FIG. 3 illustrates an embodiment of a method 300 for shortening and puncturing. Before the method 300 is described in greater detail, some definitions are also provided. Suppose a designer wishes to perform shortening of s positions and puncturing of p positions. Then, the following denotations can be employed $B_s = \lfloor s/m \rfloor$ (where "$\lfloor\ \rfloor$" denotes the floor or rounded down integer value of the ratio calculated therein), $B_p = \lfloor p/m \rfloor$, $R_s = s - mB_s$, and $R_p = s - mB_p$.

The method 300 begins by first carefully selecting an information position, a, among 0, 1, ..., k−1, where a=$B_s$+$\lceil R_s/m \rceil$ (where "$\lceil\ \rceil$" denotes the ceiling or rounded up integer value of the ratio calculated therein) and the selected information positions columns in the base matrix as shown in a block 310 can be depicted as below.

$$i_1, \ldots, i_a \in \{0, \ldots, k-1\} \quad \text{(EQ 8)}$$

Then, the method 300 continues by selecting a redundancy position, b, among k, . . . , n−1, where b=$B_p$+⌊$R_p$/m⌋ and the selected redundancy columns in the base matrix as shown in a block 320 can be depicted as below.

$$j_1, \ldots, j_b \in \{0, \ldots, k-1\} \quad \text{(EQ 9)}$$

One possible approach to determine which are the best or optimal a=$B_s$+⌈$R_s$/m⌉ information columns to select, and which are the best or optimal b=$B_p$+⌈$R_p$/m⌉ redundancy columns to select, to select is to perform searching through all of the possible combinations thereof to determine which provides for the best performance, as shown using reference numeral 305.

For example, this could be performed by going "brute force" through all of the possible combinations, performing simulations on the various combinations, and selecting the best option there from.

The method 300 then continues by shortening all entries $$c_{i_1}, c_{i_2}, \ldots, c_{i_{B_s}}$$

(shown as CI in FIG. 3) from the original LDPC codeword, C, in (EQ 6), and shortening $R_s$ consecutive positions in the $c_{i_a}$ component of the original LDPC codeword, C, if $R_s \neq 0$, as shown in a block 330. More specifically, the shortening of the elements, ($c_{i_a,0}, c_{i_a,1}, \ldots, c_{i_a,m-1}$), is performed with respect to the original LDPC codeword, C, and this can be denoted as below.

$$c_{i_a}{'} = (c_{i_a,R_s}, c_{i_a,R_s+1}, \ldots, c_{i_a,m-1}) \quad \text{(EQ 10)}$$

In addition, the method 300 then continues by puncturing all entries $$c_{j_1}, c_{j_2}, \ldots, c_{j_{B_p}}$$

(shown as CJ in FIG. 3) from the original LDPC codeword, C, in (EQ 6), and puncturing $R_p$ consecutive positions in the $c_{j_b}$ component of the original LDPC codeword, C, if $R_p \neq 0$, as shown in a block 340. More specifically, the puncturing of the elements, ($c_{j_b,0}, c_{j_b,1}, \ldots, c_{j_b,R_p-1}$), is performed with respect to the original LDPC codeword, C, and this can be denoted as below.

$$c_{j_b}{'} = (c_{j_b,R_p}, c_{j_b,R_p+1}, \ldots, c_{j_b,m-1}) \quad \text{(EQ 11)}$$

The following denotations can also be employed.

$$\{u_1, u_2, \ldots, u_{k-B_s}\} = \{0, \ldots, k-1\} \setminus \{i_1, \ldots, i_{B_s}\} \quad \text{(EQ 12)}$$

with $u_1 < u_2 < \ldots < u_{k-B_s}$. When $R_s \neq 0$, then one of $u_1, u_2, \ldots, u_{k-B_s}$ is $i_b$.

Furthermore, the following denotations can also be employed.

$$\{v_1, v_2, \ldots, v_{n-k-B_p}\} = \{k, \ldots, n-1\} \setminus \{j_1, \ldots, j_{B_p}\} \quad \text{(EQ 13)}$$

with $v_1 < v_2 < \ldots < v_{n-k-B_p}$. When $R_p \neq 0$, then one of $v_1, v_2, \ldots, v_{n-k-B_p}$ is $i_b$.

Then the LDPC codeword of the new LDPC code, $C_{new}$, (after undergoing the shortening and puncturing) can be depicted as below.

$$C_{new} = \left(c'_{u_1}, c'_{u_2}, \ldots, c'_{u_{k-B_s}}, c'_{v_1}, c'_{v_2}, \ldots, c'_{v_{n-k-B_p}}\right) \quad \text{(EQ 14)}$$

such that $c_r{'} = c_r$ if $r \neq i_a$ when $R_s \neq 0$ and if $r \neq j_b$ when $R_p \neq 0$.

In implementation within a communication device that is operable to perform encoding of information bits according to the original LDPC code (i.e., before undergoing any shortening and puncturing), then the very same encoder can at least one perform encoding of information bits according to the new LDPC code as described below.

Suppose the information bits of a codeword of the new LDPC code are depicted as below.

$$b = (b_0, \ldots, b_{k-1}) \quad \text{(EQ 15)}$$

Then let $$\left(c'_{u_1}, c'_{u_2}, \ldots, c'_{u_{k-B_s}}\right) = b$$

and let the rest of the components in the LDPC codeword (i.e., ($c_0{'}, c_1{'}, \ldots, c_{k-1}{'}$)) be 0 (i.e., zero), where $c_i{'}$ consists of m components. Then the encoder of the original LDPC code can be employed to encode ($c_0{'}, c_1{'}, \ldots, c_{k-1}{'}$).

The encoder then outputs the redundant bits as $c_k{'}, \ldots, c_{n-1}{'}$. From there, only the components $$\left(c'_{v_1}, c'_{v_2}, \ldots, c'_{v_{n-k-B_p}}\right)$$

are taken to be the redundant bits for the new LDPC code. Therefore, the LDPC codeword of the new LDPC code, $C_{new}$, (after undergoing the shortening and puncturing) can be depicted as below.

$$C_{new} = \left(b, c'_{v_1}, c'_{v_2}, \ldots, c'_{v_{n-k-B_p}}\right) \quad \text{(EQ 16)}$$

It is noted also that a first shortening and puncturing and a second shortening and puncturing can be generated using the principles described herein, such that each of the first shortening and puncturing and the second shortening and puncturing can then employ the very same original low density parity check matrix, H, to generate a first LDPC coded signal and a second LDPC coded signal. Also, because of the unique nature of this novel approach to shortening and puncturing presented herein, the very same LDPC matrix can then be employed to decode two different signals that have been generated using the first shortening and puncturing and the second shortening and puncturing, respectively. For example, a communication device can encode information bits according to the first shortening and puncturing and the second shortening and puncturing to generate a first LDPC coded signal and a second LDPC signal. In addition, a communication device can employ the very same low density parity check matrix, H, to decode a third LDPC coded signal (that has been generated using the first shortening and puncturing) and a fourth LDPC coded signal (that has been generated using the second shortening and puncturing).

Figure 4:
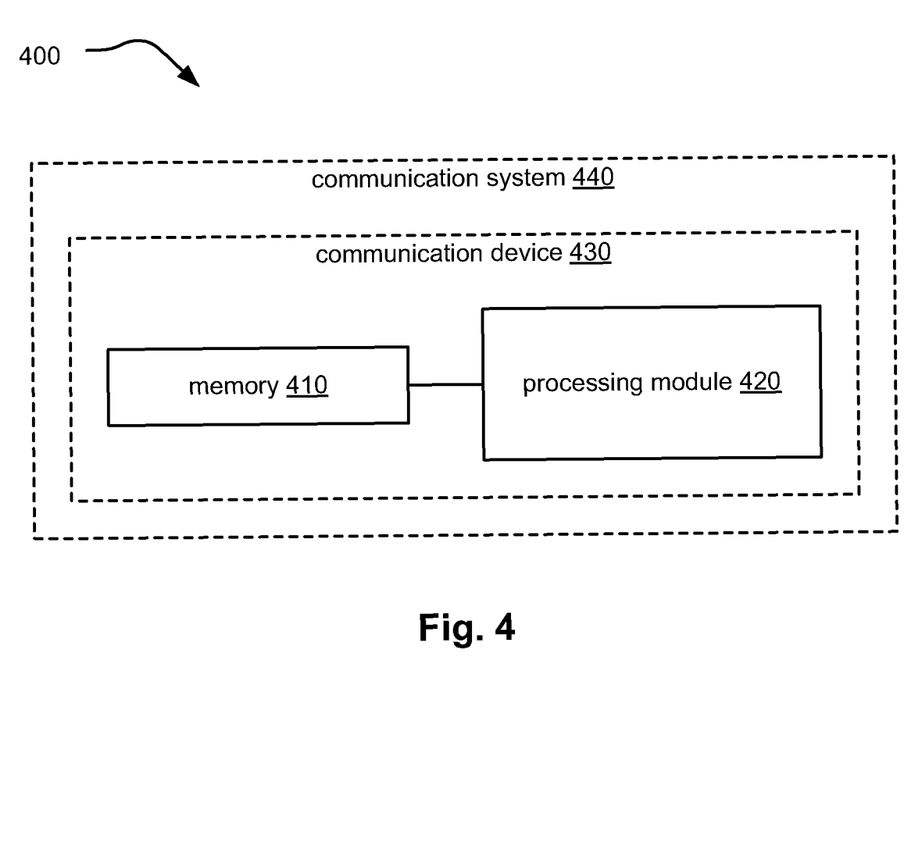
FIG. 4 illustrates an embodiment of an apparatus that is operable to perform encoding and/or decoding of multiple LDPC coded signals using shortening and puncturing.

FIG. 4 illustrates an embodiment of an apparatus 400 that is operable to construct at least one parity check matrix corresponding to at least one LDPC code. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform LDPC code construction and processing of an LDPC coded signal using any of the various embodiments described herein.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the apparatus 400 can be implemented within any of a variety of communication systems 440 as well.

If desired in some embodiments, the parity check matrix of the LDPC code can be provided from the apparatus 400 to the communication system 440 that is operable to employ and perform error correcting coding using that LDPC code. The parity check matrix of the LDPC code can also be provided from the apparatus 400 to any of a variety of communication devices 430 implemented within the communication system 440 as well. This way, a completely integrated means is provided by which the parity check matrix of the LDPC code can be constructed in hardware and provided to one or more the communication devices 430 implemented within a communication system 440 to employ that LDPC code. If desired, the apparatus 420 can be designed to generate multiple parity check matrices corresponding to multiple LDPC codes as well. In some embodiments, the apparatus 420 can selectively provide different information (corresponding to different LDPC codes) to different communication devices and/or communication systems. That way, different communication links between different communication devices can employ different error correcting coding. Clearly, the apparatus 420 can also provide the same information (corresponding to a singular LDPC code) to each of different communication devices and/or communication systems as well without departing from the scope and spirit of the invention.

Figure 5:
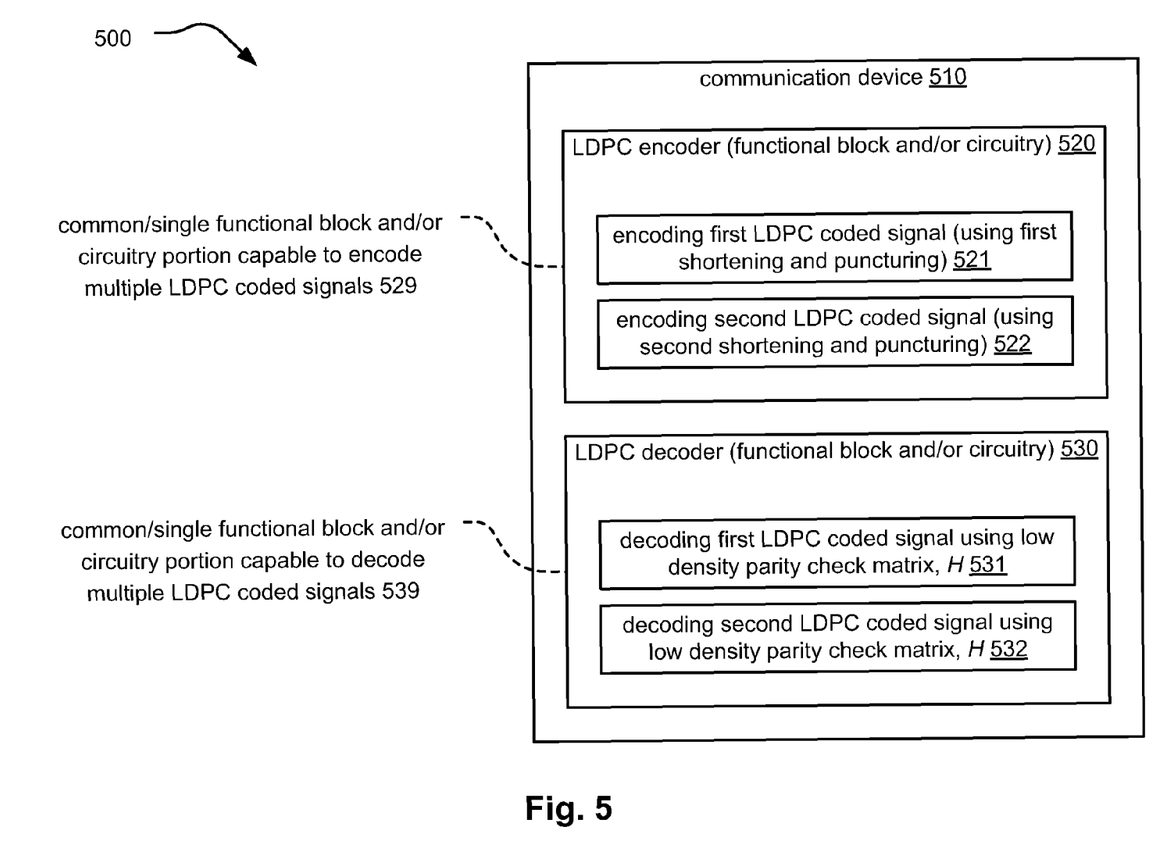
FIG. 5 illustrates an embodiment of a communication device employing common functional block and/or circuitry for encoding and decoding, respectively, of multiple LDPC coded signals.

FIG. 5 illustrates an embodiment of a communication device 500 employing common functional block and/or circuitry for encoding and decoding, respectively, of multiple LDPC coded signals. Using the novel approach to shortening and puncturing presented herein, the various LDPC codes constructed thereby have a common structure and can thereby be processed (e.g., encoding or decoding processing) using a common functional block and/or circuitry portion.

Looking at the communication device 510, the communication device 510 includes an LDPC encoder (implemented using a singular functional block and/or circuitry portion) 520 and an LDPC decoder (implemented using a singular functional block and/or circuitry portion) 530. The LDPC encoder 520 is operable to encode information bits according to the same low density parity check matrix, H, but according to a wide variety of shortening and puncturing approaches applied to the same low density parity check matrix, H. For example, the LDPC encoder is operable to perform encoding to generate a first LDPC coded signal (using first shortening and puncturing), as shown in a block 521; the LDPC encoder 520 is also operable to perform encoding to generate a second LDPC coded signal (using second shortening and puncturing), as shown in a block 522.

In addition, the LDPC decoder 530 is operable to decode at least two separate LDPC coded signals using the very same low density parity check matrix, H. The LDPC decoder 530 is operable to perform decoding of a first LDPC coded signal using a low density parity check matrix, H, as shown in a block 531; the LDPC decoder 532 is also operable to perform decoding of a second LDPC coded signal using the very same low density parity check matrix, H, as shown in a block 532.

Again, it is noted that, thanks to the novel shortening and puncturing approach presented herein, the LDPC encoder 520 is operable to employ a common/single functional block and/or circuitry portion capable to encode multiple LDPC coded signals that all can be generated according to the very same low density parity check matrix, H, but with different shortening and puncturing applied thereto, as shown using reference numeral 529.

Analogously, thanks to the novel shortening and puncturing approach presented herein, the LDPC decoder 530 is operable to employ a common/single functional block and/or circuitry portion capable to decode multiple LDPC coded signals that all have been generated according to the very same low density parity check matrix, H, but with different shortening and puncturing applied thereto, as shown using reference numeral 539. In addition, because of the novel shortening and puncturing approach presented herein, different shortening and puncturing can be employed to generate two different LDPC coded signals, yet each of the LDPC coded signals can still have the very same code rate. Clearly, more than two LDPC codes may be employed for each of the LDPC encoder 520 and the LDPC decoder 530, respectively, while still using a common/single functional block and/or circuitry portion.

In this disclosure, a performance diagram is described in the context of BLER (Block Error Rate) versus $E_b/N_o$ (ratio of energy per bit $E_b$ to the Spectral Noise Density $N_o$). BLER is oftentimes used in the context of wireless communications where if any one bit in a block is determined to be in error, then the entire block is determined to be in error. In some other communication system application, performance may be viewed in terms of BER (Bit Error Rate) vs. $E_b/N_o$. This term $E_b/N_o$ is the measure of SNR (Signal to Noise Ratio) for a digital communication system. When looking at these performance curves, the BLER may be determined for any given $E_b/N_o$ (or SNR) thereby providing a relatively concise representation of the performance of the coding approach.

Figure 6:
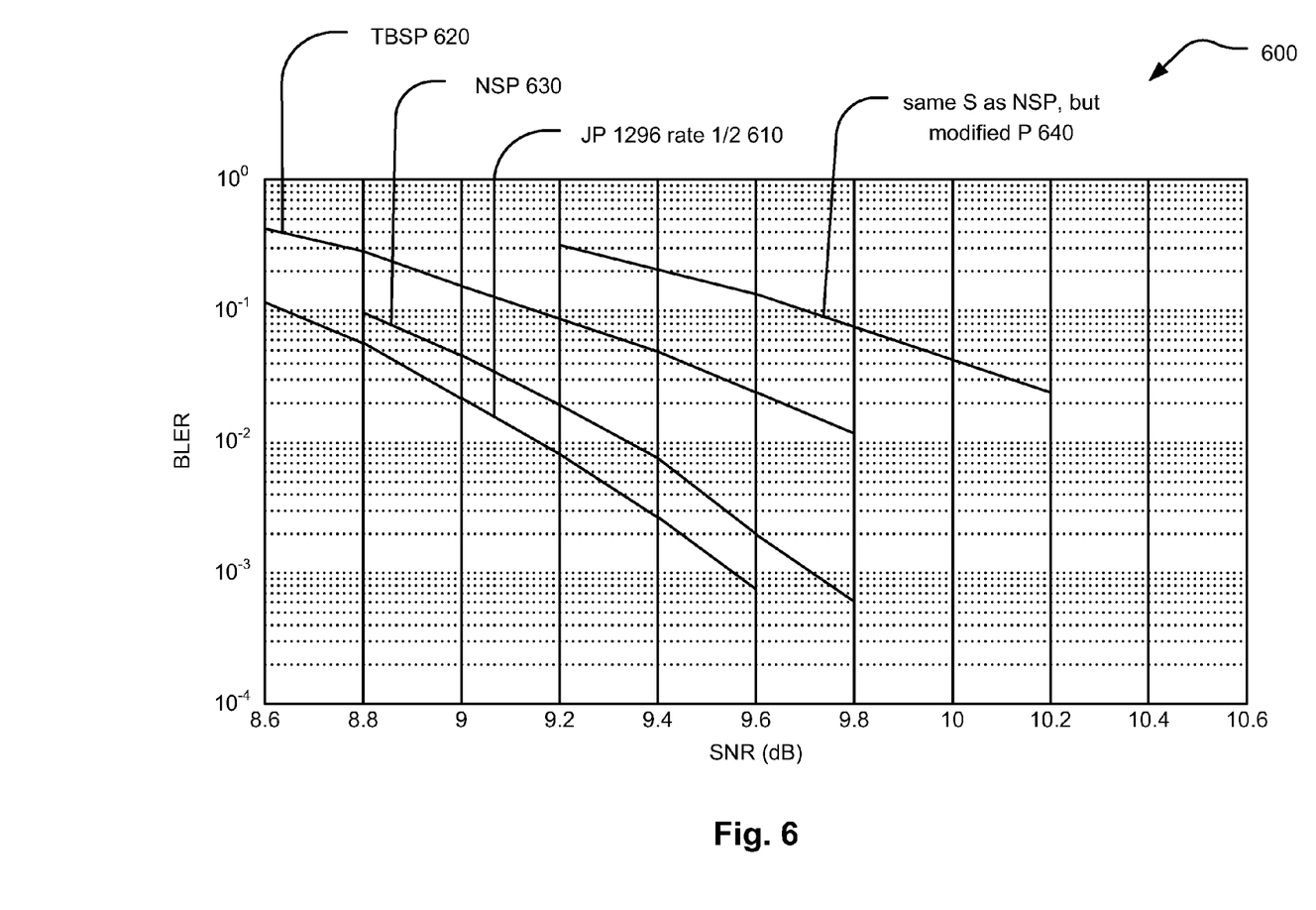
FIG. 6 illustrates an embodiment of a performance comparison of LDPC codes generated by shortening and puncturing from an LDPC code having block size 1944 to LDPC codes having block sizes 1296.

FIG. 6 illustrates an embodiment 600 of a performance comparison of LDPC codes generated by shortening and puncturing from an LDPC code having block size 1944 to LDPC codes having block sizes 1296.

Example 3

Consider rate 1/2 block size 1944 LDPC code in the [a] reference depicted above, where the low density parity check matrix, H, is defined below.

The following table consists of a plurality of entries such that every entry represents a 81×81 sub-matrix, where an actual number in the entry location indicates the shift position that is used to construct the CSI sub-matrix (e.g., right cyclic shifting of the identity matrix by that number of positions), and an empty space indicates an all zero-valued (i.e., all elements are 0) 81×81 sub-matrix. The table is depicted using two paragraphs because of its width. The entire Table includes 12 rows and 24 columns. The first Table portion includes columns 1-12 and the second Table portion includes columns 13-24.

Rows 1-12, Columns 1-12

| | | | | | | | | | | | |
|---|---|---|---|---|---|---|---|---|---|---|---|
| 57 | | | | 50 | | 11 | | 50 | | 79 | |
| 3 | | 28 | | 0 | | | | 55 | 7 | | |
| 30 | | | | 24 | 37 | | | 56 | 14 | | |
| 62 | 53 | | | 53 | | | 3 | 35 | | | |
| 40 | | | 20 | 66 | | | 22 | 28 | | | |
| 0 | | | | 8 | | 42 | | 50 | | | 8 |
| 69 | 79 | 79 | | | | 56 | | 52 | | | |
| 65 | | | | 38 | 57 | | | 72 | | 27 | |
| 64 | | | | 14 | 52 | | | 30 | | 32 | |
| | 45 | | 70 | 0 | | | | 77 | 9 | | |
| 2 | 56 | | 57 | 35 | | | | | | 12 | |
| 24 | | 61 | | 60 | | | 27 | 51 | | | 16 |

Rows 1-12, Columns 13-24

| | | | | | | | | | | | |
|---|---|---|---|---|---|---|---|---|---|---|---|
| 1 | 0 | | | | | | | | | | |
| | 0 | 0 | | | | | | | | | |
| | | 0 | 0 | | | | | | | | |
| | | | 0 | 0 | | | | | | | |
| | | | | 0 | 0 | | | | | | |
| | | | | | 0 | 0 | | | | | |
| 0 | | | | | | 0 | 0 | | | | |
| | | | | | | | 0 | 0 | | | |
| | | | | | | | | 0 | 0 | | |
| | | | | | | | | | 0 | 0 | |
| | | | | | | | | | | 0 | 0 |
| 1 | | | | | | | | | | | 0 |

As can be seen, there are 24 columns and 12 rows in the base matrix. Again, each sub-matrix is a 81×81 sub-matrix. The modification of this low density parity check matrix, H, can be performed by shortening 324 positions as well as puncturing 324 positions for 16 QAM (Quadrature Amplitude Modulation) when considering a Rayleigh fading communication channel (e.g., see Example 1).

Then, $B_s=4$, $R_s=0$, $B_p=4$, $R_p=0$. The information base columns are ordered from left to right by 0 to 11, and the redundancy base columns are ordered from left to right by 0 to 11 (for a total of 24 columns). Then, one possible optimal selection of shortening base columns is 5, 8, 9, 10, and one possible optimal selection of puncturing base columns is 1, 3, 7, 9.

With this novel shortening and puncturing selection (shown as NSP 630), a gain of 0.5 dB in terms of BLER (Block Error Rate) can be achieved when compared to the prior art "text book" shortening and puncturing (shown as TBSP 620) which is described and referenced above. This performance improvement is depicted in the diagram (FIG. 6).

FIG. 6 also provides additional information. There is only approximately a 0.175 dB loss when compared to the block size 1296 LDPC code in the [a] reference (shown as JP 1296 rate 1/2 610). It is noted that the block size 1296 LDPC code in the [a] reference has sub-matrices of a different size and also has a different structure. In addition, the puncturing positions that are selected are very important and largely determinative of the overall performance. If an improper or "not best" selection is made, a performance loss of more than 1 dB may undesirably be realized; this can be seen be considering reference numeral 640, which corresponds to performing the same shortening (S) as the novel shortening and puncturing approach, but with a modified puncturing.

The [a] reference, the [d] reference, and the [e] reference (all depicted above) suggest the shortening and puncturing (SP) ratio should not be less than 1.2. However, based on the novel approach to shortening and puncturing presented herein, it seems evident that this prior art prescribed SP ratio may not be correct at all. Furthermore, by requiring this limitation, an LDPC code designer is unduly prohibited from and restricted from choosing and designing certain LDPC codes.

Figure 7:
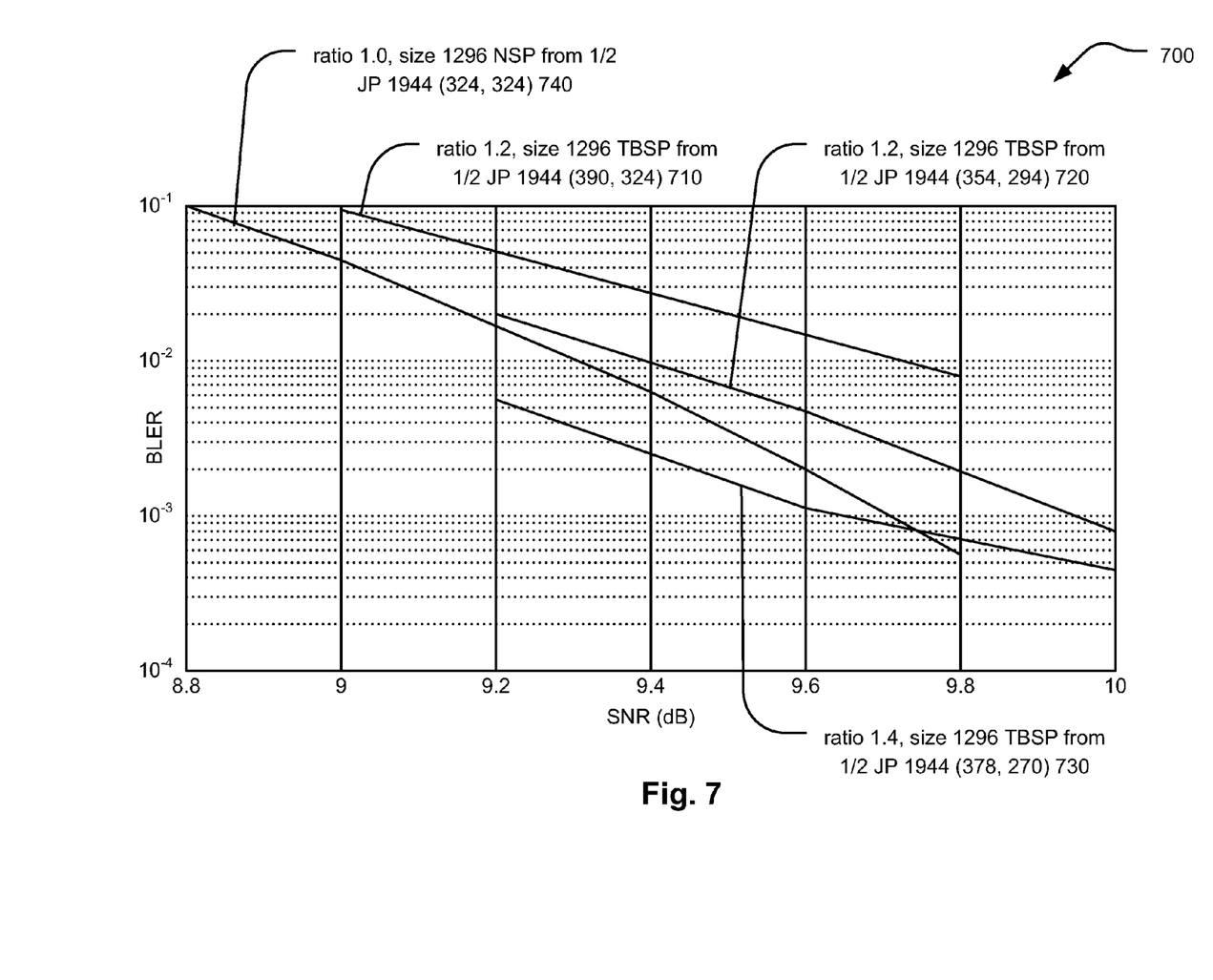
FIG. 7 illustrates an embodiment of a performance comparison of LDPC codes having different shortening and puncturing ratios.

FIG. 7 illustrates an embodiment 700 of a performance comparison of LDPC codes having different shortening and puncturing ratios. FIG. 7 shows that an LDPC code generated with the novel approach presented herein and with an SP ratio of 1 (shown by ratio 1.0, size 1296 NSP from 1/2 JP 1944 (324, 324) 740) actually outperforms an LDPC code having an SP ratio of 1.2 (shown by ratio 1.2, size 1296 TBSP from 1/2 JP 1944 (354, 294) 720), and that is generated using the prior art "text book" approach to shortening and puncturing presented above, by approximately 0.2 dB at a BLER=1e-3 ($1 \times 10^{-3}$). Both of the LDPC codes being compared have the same length.

The LDPC code generated with the novel approach presented herein and with an SP ratio of 1 (reference numeral 740) also provides a better performance than an LDPC code having an SP ratio of 1.4 (shown by ratio 1.4, size 1296 TBSP from 1/2 JP 1944 (378, 270) 730), and that is generated using the prior art "text book" approach to shortening and puncturing presented above, at a BLER below 1e-3 ($1 \times 10^{-3}$). One of the very evident and important advantages of being able to employ a SP ratio of 1 is that it does not change the code rate. This flexibility and capability can be very desirable when designing a communication device to accommodate a variety of LDPC codes.

Another LDPC code which is compared is depicted as a shortening and puncturing ratio 1.2 LDPC code (shown by ratio 1.2, size 1296 TBSP from 1/2 JP 1944 (390, 324) 710). As can be seen, the LDPC code generated with the novel approach presented herein and with an SP ratio of 1 (reference numeral 740) also provides significantly better performance than this LDPC code at a BLER below 1e-3 ($1 \times 10^{-3}$).

Figure 8:
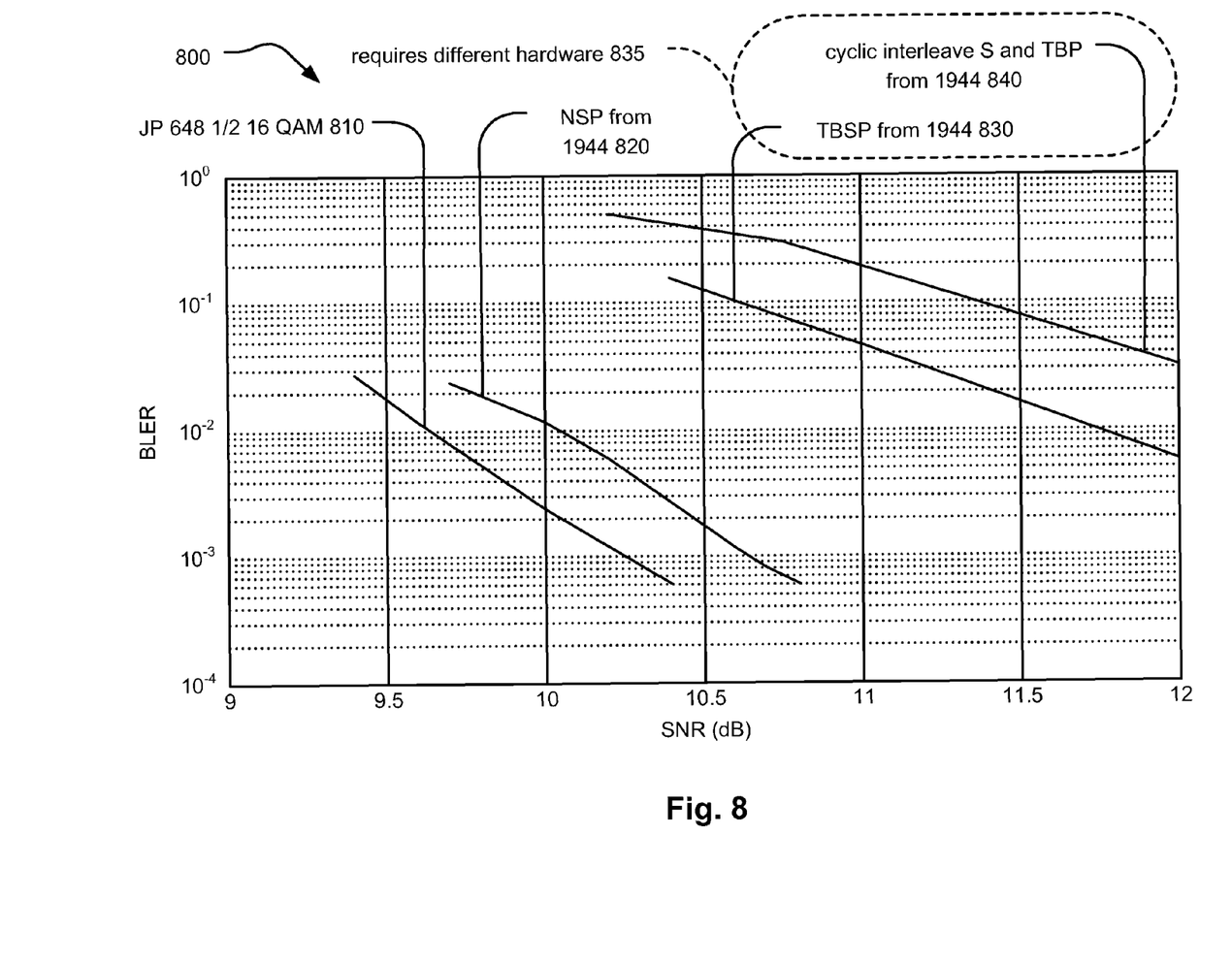
FIG. 8 illustrates an embodiment of a performance comparison of LDPC codes generated by shortening and puncturing from an LDPC code having block size 1944 to LDPC codes having block sizes 648 with code rates of 1/2.

FIG. 8 illustrates an embodiment 800 of a performance comparison of LDPC codes generated by shortening and puncturing from an LDPC code having block size 1944 to LDPC codes having block sizes 648 with code rates of 1/2.

Example 4

Consider the rate 1/2 block size 1944 LDPC code in the [a] reference depicted above that is employed in Example 3.

Consider shortening 648 positions as well as puncturing 648 positions for 16 QAM and Rayleigh fading channel, see Example 1 above.

Then $B_s=8$, $R_s=0$, $B_p=8$, $R_p=0$. The information base columns are ordered from left to right by 0 to 11, and the redundancy base columns are ordered from left to right by 0 to 11 (for a total of 24 columns). Then, one possible optimal selection of shortening base columns is 0, 1, 3, 5, 6, 8, 10, 11, and one possible optimal selection of puncturing base columns is 0, 2, 4, 5, 7, 8, 9, 10. The performance curve of the novel shortening and puncturing approach is depicted using NSP from 1944 820. With this shortening and puncturing selection, a 2 dB gain can be obtained at BLER=1e-3 ($1\times10^{-3}$) when compared to the "text book" using the SP ratio of 1.2 (shown by TBSP from 1944 830), and a 3 dB gain is achieved when compared to cyclic approach performed through the block columns as suggested in the [b] reference and the [c] reference (e.g., see FIG. 8) (shown by cyclic interleave S and TBP from 1944 840). FIG. 8 also shows there is only approximately a 0.38 dB loss when compared to the block size 648 LDPC code in the [a] reference (shown by JP 648 1/2 16 QAM 810). Again, it is noted that the block size 1296 LDPC code in the [a] reference has sub-matrices of a different size and also has a different structure. Therefore, when employing the LDPC codes corresponding to the performance curves of the reference numerals 830 and 840, there is an inherent requirement for different hardware (e.g., functional blocks and/or circuitries) to accommodate each of the different LDPC codes being processed within such a communication system and/or communication device.

Figure 9:
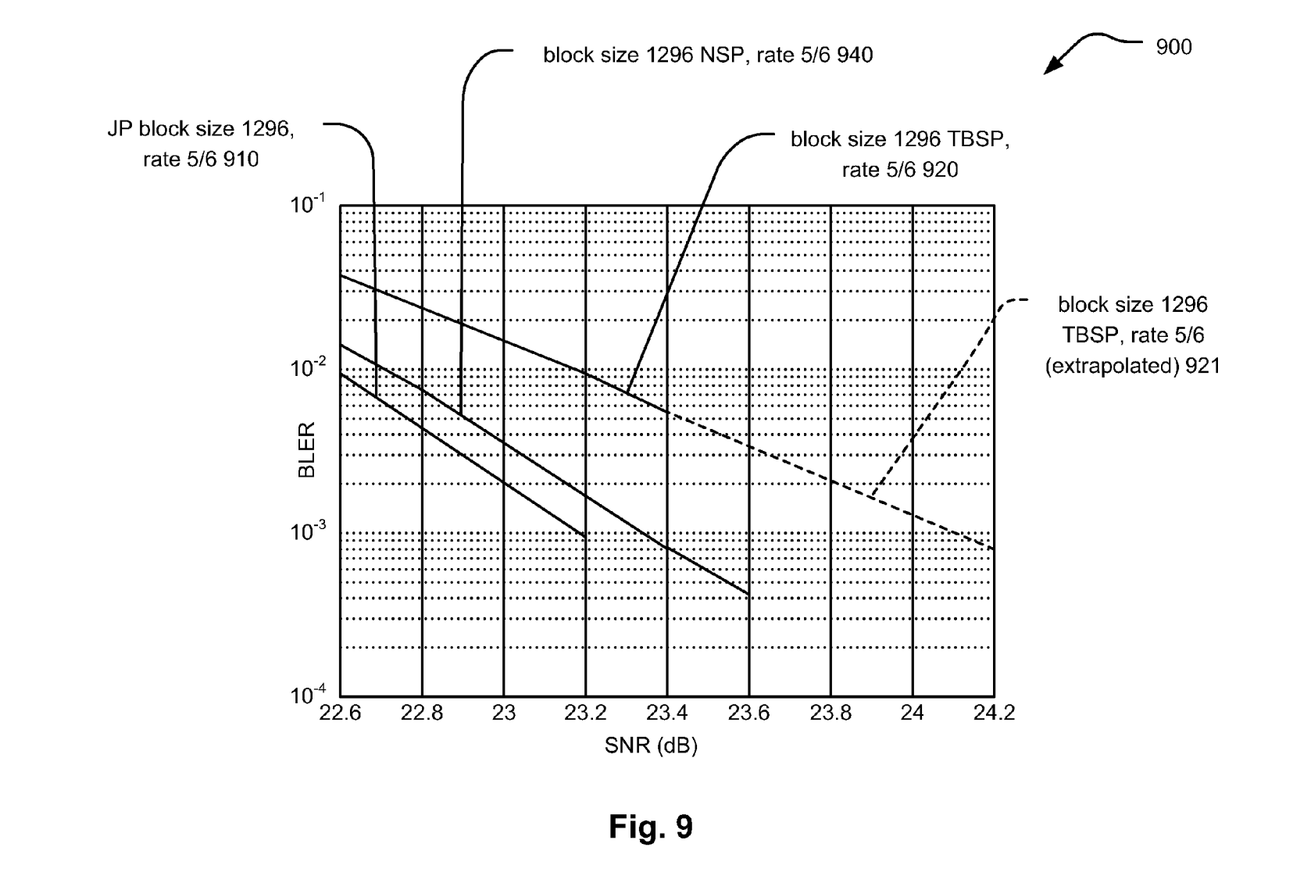
FIG. 9 illustrates an embodiment of a performance comparison of LDPC codes generated by shortening and puncturing from an LDPC code having block size 1944 to LDPC codes having block sizes 1296 with code rates of 5/6.

FIG. 9 illustrates an embodiment 900 of a performance comparison of LDPC codes generated by shortening and puncturing from an LDPC code having block size 1944 to LDPC codes having block sizes 1296 with code rates of 5/6.

Example 5

Take the rate 5/6 block size 1944 LDPC code in the [a] reference that has a low density parity check matrix, H, as depicted in the following table.

The following table consists of a plurality of entries such that every entry represents a 81×81 sub-matrix, where an actual number in the entry location indicates the shift position that is used to construct the CSI sub-matrix (e.g., right cyclic shifting of the identity matrix, I, by that number of positions), and an empty space indicates an all zero-valued (i.e., all elements are 0) 81×81 sub-matrix. The table is depicted using two paragraphs because of its width. The entire Table includes 4 rows and 24 columns. The first Table portion includes columns 1-12 and the second Table portion includes columns 13-24.

Rows 1-4, Columns 1-12

| 13 | 48 | 80 | 66 | 4  | 74 | 7  | 30 | 76 | 52 | 37 | 60 |
| 69 | 63 | 74 | 56 | 64 | 77 | 57 | 65 | 6  | 16 | 51 |    |
| 51 | 15 | 0  | 80 | 24 | 25 | 42 | 54 | 44 | 71 | 71 | 9  |
| 16 | 29 | 36 | 41 | 44 | 56 | 59 | 37 | 50 | 24 |    | 65 |

Rows 1-4, Columns 13-24

|    | 49 | 63 | 31 | 74 | 73 | 23 |    | 1 | 0 |   |   |
| 64 |    | 68 | 9  | 48 | 62 | 54 | 27 |   | 0 | 0 |   |

| 67 | 35 |    | 58 |   | 29 |    | 53 | 0 |   | 0 | 0 |
| 4  | 65 | 52 |    | 4 |    | 73 | 52 | 1 |   |   | 0 |

As can be seen, there are 24 columns and 4 rows in the base matrix. Again, each sub-matrix is a 81×81 sub-matrix. The modification of this low density parity check matrix, H, can be performed by shortening 540 positions as well as puncturing 108 positions for 16 QAM when considering a Rayleigh fading communication channel. Then, $B_s=6$, $R_s=54$, $B_p=1$, $R_p=27$. The information base columns are ordered from left to right by 0 to 19, and the redundancy base columns are ordered from left to right by 0 to 3 (for 24 columns total).

Then, one possible optimal selection of shortening base columns is 0, 1, 2, 5, 6, 11, and 16. In the base column 16, only the first 54 bits are shortened, and one possible optimal selection of puncturing base columns is 0, 1. Also, in base column 1, only the first 27 bits are punctured. With this novel shortening and puncturing selection approach (shown using block size 1296 NSP, rate 5/6 940), a gain of 0.6 dB can be achieved at BLER=1 e-3 ($1\times10^{-3}$) when compared to the "text book" (shown using block size 1296 TBSP, rate 5/6 920 and whose extrapolated value is depicted using reference numeral 921) (e.g., see FIG. 9). FIG. 9 also shows that there is only approximately a 0.15 dB loss when compared to the block size 1296 LDPC code in the [a] reference (shown using JP block size 1296, rate 5/6 910). Again, it is noted that the block size 1296 LDPC code in the [a] reference has sub-matrices of a different size and also has a different structure.

As can be seen, a novel approach to performing shortening and puncturing is presented herein that has many ancillary benefits including providing for significantly more flexibility in terms of implementing an actual communication device when compared to prior art approaches to shortening and puncturing. For example, the novel shortening and puncturing presented herein allows for construction of multiple LDPC codes all having a generally similar structure, thereby allowing for a communication device to have single functional block and/or circuitry portion that is capable to perform encoding (or decoding) processing according to all of the LDPC codes generated using this novel shortening and puncturing approach. This can provide for a significant reduction in hardware, complexity, real estate consumption, and overall cost of a communication device designed to accommodate processing of signals that comport with multiple LDPC coded signals. According to various aspects of the invention, each of the codes has a common structure (e.g., there is only one structure of the codes), and this can provide for many of the savings enumerated above.

In addition, the novel shortening and puncturing approach presented herein provides comparable performance (e.g., not much loss in terms of SNR as a function of a given BLER) than other prior art shortening and puncturing approaches. It is noted that these prior art shortening and puncturing approaches generate their multiple respective LDPC codes that have different structures, and therefore require the use of multiple functional blocks and/or circuitries in a communication device capable to process them all. Moreover, these prior art shortening and puncturing approaches have unnecessary design limitations (e.g., shortening and puncturing ratio of 1.2) that inherently limit the type of LDPC codes that can be employed within a communication system and/or communication device in which it is desirable to operate using multiple LDPC codes. The novel the novel shortening and puncturing approach presented herein allows for a shortening and puncturing ratio of 1.0, thereby allowing for greater design flexibility including the ability to maintain a common code rate for each of the LDPC codes generated thereby.

It is also noted that the methods described within the preceding figures may also be performed within any appropriate system and/or apparatus designs (e.g., communication systems, communication devices, communication transmitters, communication receivers, communication transceivers, and/or functionality described herein) without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
an LDPC (Low Density Parity Check) encoder that is operative to:
   select an LDPC code from a plurality of LDPC codes;
   receive a plurality of information bits;
   shorten at least one of the plurality of information bits, in accordance with a selected shortening of a plurality of shortenings, thereby generating a plurality of shortened information bits; and
   encode the plurality of shortened information bits, in accordance with an LDPC matrix corresponding to the LDPC code selected from the plurality of LDPC codes, thereby generating a plurality of LDPC coded bits; and wherein:
at least one of the plurality of LDPC coded bits is punctured thereby generating an LDPC coded signal.

2. The apparatus of claim 1, wherein:
the selected shortening of a plurality of shortenings and the selected encoding of a plurality of encodings form a selected shortening and puncturing combination of a plurality of shortening and puncturing combinations.

3. The apparatus of claim 1, wherein:
the LDPC encoder is operative to shorten a subset of the plurality of information bits, in accordance with the selected shortening of the plurality of shortenings, thereby generating the plurality of shortened information bits; and
the shortened subset of the plurality of information bits are distributed throughout various portions of the plurality of shortened information bits.

4. The apparatus of claim 1, wherein:
the LDPC encoder is operative to shorten a subset of the plurality of information bits, in accordance with the selected shortening of the plurality of shortenings, thereby generating the plurality of shortened information bits; and
the shortened subset of the plurality of information bits are consecutive among the plurality of shortened information bits.

5. The apparatus of claim 1, wherein:
the apparatus is a communication device that is operative to be implemented within at least one of a satellite communication system, a wireless communication system, a wired communication system, and a fiber-optic communication system.

6. The apparatus of claim 1, wherein the LDPC encoder is operative to:
shorten at least one of the plurality of information bits, in accordance with the selected shortening of the plurality of shortenings, thereby generating a first plurality of shortened information bits;
encode the first plurality of shortened information bits, in accordance with the LDPC matrix corresponding to the LDPC code selected from the plurality of LDPC codes, thereby generating a first plurality of LDPC coded bits;
shorten at least one of the plurality of information bits, in accordance with at least one additional selected shortening of the plurality of shortenings, thereby generating a second plurality of shortened information bits; and
encode the second plurality of shortened information bits, in accordance with at least one additional LDPC matrix corresponding to at least one additional LDPC code selected from the plurality of LDPC codes, thereby generating a second plurality of LDPC coded bits.

7. The apparatus of claim 6, wherein:
the at least one additional LDPC matrix is the LDPC matrix.

8. The apparatus of claim 6, wherein the LDPC encoder is operative to:
puncture a first consecutive plurality of LDPC coded bits of the first plurality of LDPC coded bits, in accordance with a selected puncturing of a plurality of puncturings, thereby generating the LDPC coded signal; and
puncture a second consecutive plurality of LDPC coded bits of the second plurality of LDPC coded bits, in accordance with at least one additional selected puncturing of the plurality of puncturings, thereby generating at least one additional LDPC coded signal.

9. The apparatus of claim 6, wherein the LDPC encoder is operative to:
puncture at least one of the first plurality of LDPC coded bits, in accordance with a selected puncturing of a plurality of puncturings, thereby generating the LDPC coded signal; and
puncture at least one of the second plurality of LDPC coded bits, in accordance with at least one additional selected puncturing of the plurality of puncturings, thereby generating at least one additional LDPC coded signal.

10. The apparatus of claim 9, wherein:
the LDPC coded signal has a code rate; and
the at least one additional LDPC coded signal has the code rate.

11. The apparatus of claim 9, wherein:
the LDPC coded signal has a first code rate; and
the at least one additional LDPC coded signal has a second code rate.

12. An apparatus, comprising:
an LDPC (Low Density Parity Check) encoder that is operative to:
   select an LDPC code from a plurality of LDPC codes;
   receive a plurality of information bits;
   shorten a subset of the plurality of information bits, in accordance with a selected shortening of a plurality of shortenings, thereby generating a plurality of shortened information bits; and
   encode the plurality of shortened information bits, in accordance with an LDPC matrix corresponding to the LDPC code selected from the plurality of LDPC codes, thereby generating a plurality of LDPC coded bits; and
   puncture at least one of the plurality of LDPC coded bits, in accordance with a selected puncturing of a plurality of puncturings, thereby generating an LDPC coded signal; and wherein:
the shortened subset of the plurality of information bits are consecutive among the plurality of shortened information bits.

13. The apparatus of claim 12, wherein the LDPC encoder is operative to:
puncture a consecutive plurality of LDPC coded bits of the plurality of LDPC coded bits, in accordance with the selected puncturing of the plurality of puncturings, thereby generating the LDPC coded signal.

14. The apparatus of claim 12, wherein:
the apparatus is a communication device that is operative to be implemented within at least one of a satellite communication system, a wireless communication system, a wired communication system, and a fiber-optic communication system.

15. The apparatus of claim 12, wherein the LDPC encoder is operative to:
shorten a first subset of the plurality of information bits, in accordance with the selected shortening of the plurality of shortenings, thereby generating a first plurality of shortened information bits;
encode the first plurality of shortened information bits, in accordance with the LDPC matrix corresponding to the LDPC code selected from the plurality of LDPC codes, thereby generating a first plurality of LDPC coded bits;
shorten a second subset of the plurality of information bits, in accordance with at least one additional selected shortening of the plurality of shortenings, thereby generating a second plurality of shortened information bits; and
encode the second plurality of shortened information bits, in accordance with at least one additional LDPC matrix corresponding to at least one additional LDPC code selected from the plurality of LDPC codes, thereby generating a second plurality of LDPC coded bits.

16. The apparatus of claim 15, wherein:
the at least one additional LDPC matrix is the LDPC matrix.

17. The apparatus of claim 15, wherein the LDPC encoder is operative to:
puncture a first consecutive plurality of LDPC coded bits of the first plurality of LDPC coded bits, in accordance with a selected puncturing of a plurality of puncturings, thereby generating the LDPC coded signal; and
puncture a second consecutive plurality of LDPC coded bits of the second plurality of LDPC coded bits, in accordance with at least one additional selected puncturing of the plurality of puncturings, thereby generating at least one additional LDPC coded signal.

18. A method, comprising:
selecting an LDPC (Low Density Parity Check) code from a plurality of LDPC codes;
receiving a plurality of information bits;
shortening at least one of the plurality of information bits, in accordance with a selected shortening of a plurality of shortenings, thereby generating a plurality of shortened information bits; and
employing an LDPC (Low Density Parity Check) encoder to encode the plurality of shortened information bits, in accordance with an LDPC matrix corresponding to the LDPC code selected from the plurality of LDPC codes, thereby generating a plurality of LDPC coded bits; and
puncturing at least one of the plurality of LDPC coded bits thereby generating an LDPC coded signal.

19. The method of claim 18, further comprising:
shortening at least one of the plurality of information bits, in accordance with the selected shortening of the plurality of shortenings, thereby generating a first plurality of shortened information bits;
employing the LDPC matrix, corresponding to the LDPC code selected from the plurality of LDPC codes, to encode the first plurality of shortened information bits thereby generating a first plurality of LDPC coded bits;
puncturing at least one of the first plurality of LDPC coded bits, in accordance with a selected puncturing of a plurality of puncturings, thereby generating the LDPC coded signal;
shortening at least one of the plurality of information bits, in accordance with at least one additional selected shortening of the plurality of shortenings, thereby generating a second plurality of shortened information bits;
employing at least one additional LDPC matrix, corresponding to at least one additional LDPC code selected from the plurality of LDPC codes, to encode the second plurality of shortened information bits thereby generating a second plurality of LDPC coded bits; and
puncturing at least one of the second plurality of LDPC coded bits, in accordance with at least one additional selected puncturing of the plurality of puncturings, thereby generating at least one additional LDPC coded signal.

20. The method of claim 19, wherein:
the at least one additional LDPC matrix is the LDPC matrix.

* * * * *